(12) United States Patent
Lee et al.

(10) Patent No.: US 10,171,063 B2
(45) Date of Patent: Jan. 1, 2019

(54) FILTER MODULE

(71) Applicant: WISOL CO., LTD., Osan-si, Gyeonggi-do (KR)

(72) Inventors: Wook Jae Lee, Hwaseong-si (KR); Seung Jae Lee, Yongin-si (KR)

(73) Assignee: WISOL CO., LTD., Osan-si, Gyeonggi-Do (KR)

( * ) Notice: Subject to any disclaimer, the term of this patent is extended or adjusted under 35 U.S.C. 154(b) by 361 days.

(21) Appl. No.: 15/062,385

(22) Filed: Mar. 7, 2016

(65) Prior Publication Data

US 2016/0269001 A1    Sep. 15, 2016

(30) Foreign Application Priority Data

Mar. 9, 2015  (KR) .................. 10-2015-0032571
Mar. 9, 2015  (KR) .................. 10-2015-0032572
Sep. 8, 2015  (KR) .................. 10-2015-0127146

(51) Int. Cl.
  *H03H 9/54*   (2006.01)
  *H03H 9/05*   (2006.01)
  *H01Q 5/50*   (2015.01)

(52) U.S. Cl.
  CPC ............ *H03H 9/545* (2013.01); *H01Q 5/50* (2015.01); *H03H 9/059* (2013.01); *H03H 9/0542* (2013.01); *H03H 9/542* (2013.01); *H01L 2224/16225* (2013.01); *H01L 2924/181* (2013.01)

(58) Field of Classification Search
  CPC ........ H01Q 5/50; H03H 9/0542; H03H 9/059; H03H 9/545; H03H 9/542; H01L 2224/16225; H01L 2924/181
  USPC .................. 333/133, 187, 188, 193–196
  See application file for complete search history.

(56) References Cited

U.S. PATENT DOCUMENTS 8,531,252 B2 * 9/2013 Nakamura et al. ........... 333/133
2012/0286878 A1 * 11/2012 Dening et al. ................ 330/296

FOREIGN PATENT DOCUMENTS

| JP | 07-058586 A    | 3/1995  |
| JP | 2003-304139    | 10/2003 |
| JP | 2010-177559 A  | 8/2010  |
| JP | 2012-182604 A  | 9/2012  |
| KR | 10-2005-0098346 A | 10/2005 |
| KR | 10-2006-0115531 A | 11/2006 |

OTHER PUBLICATIONS

Machine English Translation of 10-2005-0098346 Published on Oct. 12, 2005.*
KIPO Office Action for Korean Application No. 10-2015-0127146 which corresponds to the above-referenced U.S. application, dated Aug. 23, 2016.

* cited by examiner

*Primary Examiner* — Robert J Pascal
*Assistant Examiner* — Jorge L Salazar, Jr.
(74) *Attorney, Agent, or Firm* — LRK Patent Law Firm

(57) ABSTRACT

The present invention relates to a filter module including a substrate, a plurality of filters formed on the substrate, an amplifier formed on the substrate, a connection part for connecting the plurality of filters and the amplifier to the substrate, and a cover layer formed on the substrate to cover the plurality of filters and the amplifier.

17 Claims, 11 Drawing Sheets

FILTER MODULE

CROSS-REFERENCE TO RELATED APPLICATIONS

This application claims priority to Korean Patent Application Nos. 10-2015-0032571, filed Mar. 9, 2015, 10-2015-0032572, filed Mar. 9, 2015, and 10-2015-0127146, filed Sep. 8, 2015, the entire disclosure of which is incorporated herein by reference for all purposes.

BACKGROUND OF THE INVENTION

1. Field of the Invention

A conventional method of fixing each individual element on a substrate using a surface mount technology (SMT) has a problem in that the mounting area is increased due to the increased number of components and product size, and the present invention relates to a filter module fixed to a substrate using an ultrasonic boding process and capable of using a plurality of bandwidths different from each other.

2. Description of the Related Art

Various elements, such as a filter for passing data received from an antenna, an amplifier and the like, are included in a cellular phone or a communication device. Conventionally, a surface mount technology (SMT) for directly attaching various components such as filters, matching elements, amplifiers and the like on a substrate has been used.

The surface mount technology is a technique of mounting and soldering surface mounting type components on the surface of a printed circuit board, which is a method of mounting and curing semiconductors, diodes, chips and the like on the printed circuit board using a plurality of equipment, and the components can be arranged on both sides of the printed circuit board.

Although a miniaturizing technique has been developed gradually through the surface mount technology, the surface mount technology progresses surface mounting after packaging each element and thus is disadvantageous in that a wafer chip cannot be smaller than a predetermined size (2.0×1.6 mm) since the wafer chip should be cut to have a margin in addition to the size of the elements when the wafer chip is cut. Accordingly, a method of manufacturing a filter module for substituting for the surface mount technology is required recently in order to manufacture a miniaturized filter module required by a cellular phone or a communication device.

In addition, since the frequency of using various bandwidths (e.g., GPS, 3G/WCDMA, 4G/LTE and the like) in a cellular phone or a communication device is increased recently, a technique of simultaneously using several frequency bands in a device is required.

SUMMARY OF THE INVENTION

Therefore, the present invention has been made in view of the above problems, and it is an object of the present invention to implement a filter module having an area (1.5×1.1 mm) reduced to about a half of the area (2.0×1.6 mm) of a conventional module by providing a filter module attached on a substrate through a connection part and bonded thereon using an ultrasonic bonding process.

In addition, another object of the present invention is to provide a filter module, in which a plurality of filters individually passes a frequency different from the others by separating input terminals and connecting output terminals of the plurality of filters.

In addition, another object of the present invention is to provide various filter modules used in a cellular phone or a communication device, such as a filter module arranging a filter, a matching element and an amplifier in order, a filter module arranging a matching element, an amplifier and a filter in order, a filter module arranging a filter and an amplifier in order, a filter module arranging an amplifier and a filter in order and the like.

To accomplish the above objects, according to one aspect of the present invention, there is provided a filter module including a substrate, a plurality of filters formed on the substrate, an amplifier formed on the substrate and electrically connected to the plurality of filters, a connection part for connecting the plurality of filters and the amplifier to the substrate, and a cover layer formed on the substrate to cover the plurality of filters and the amplifier, in which the plurality of filters and the amplifier are simultaneously or sequentially packaged.

In addition, in the filter module according to an embodiment of the present invention, an input terminal and an output terminal of each of the plurality of filters and an input terminal and an output terminal of the amplifier are formed on the substrate, and the input terminal and the output terminal of each of the plurality of filters are electrically connected to the input terminal and the output terminal of the amplifier through a via pad formed on the substrate.

In addition, in the filter module according to an embodiment of the present invention, input terminals of the plurality of filters are independent from each other, output terminals thereof are connected to each other, and the plurality of filters are connected in parallel between the input terminals and the output terminals.

In addition, in the filter module according to an embodiment of the present invention, the connection part is a bump ball, and the bump ball is in a shape of an elliptical ball distorted in a predetermined direction, and the connection part is connected to an electrode previously patterned on the substrate.

In addition, the filter module according to an embodiment of the present invention may further include a matching element for matching impedance of the elements formed on the substrate. At this point, the matching element is connected between the output terminals of the plurality of filters and the input terminal of the amplifier and formed in a shape of a layered spiral in a space between the input terminals and the output terminals of the plurality of filters.

In addition, in the filter module according to an embodiment of the present invention, the plurality of filters passes frequencies different from each other, and the substrate has a long side of 1.4 to 1.6 mm and a short side of 1.0 to 1.2 mm.

In addition, in the filter module according to an embodiment of the present invention, the plurality of filters is at least any one of a single SAW filter, a dual SAW filter and a triple SAW filter.

Meanwhile, a mobile communication terminal according to an embodiment of the present invention includes an antenna, and a filter module connected to the antenna, in which the filter module includes a substrate, a plurality of filters formed on the substrate, an amplifier formed on the substrate, a connection part for connecting the plurality of filters and the amplifier to the substrate, and a cover layer formed on the substrate to cover the plurality of filters and the amplifier.

On the other hand, a filter module according to an embodiment of the present invention includes a substrate, a plurality of filters formed on the substrate, a plurality of amplifiers formed on the substrate and electrically connected to the plurality of filters, a connection part for connecting the plurality of filters and the plurality of amplifiers to the substrate, and a cover layer formed on the substrate to cover the plurality of filters and the plurality of amplifiers, in which the plurality of filters and the plurality of amplifiers are simultaneously or sequentially packaged.

In addition, the filter module according to an embodiment of the present invention further includes a plurality of matching elements for matching impedance of the elements formed on the substrate. At this point, the plurality of filters, the plurality of amplifiers and the plurality of matching elements are simultaneously or sequentially packaged.

In addition, in the filter module according to an embodiment of the present invention, the plurality of filters is at least any one of a single SAW filter, a dual SAW filter and a triple SAW filter.

On the other hand, a filter module according to an embodiment of the present invention includes a substrate, a filter formed on the substrate and connected between an antenna and an amplifier, the amplifier formed on the substrate and connected between the filter and an RF output terminal to amplify a signal received from the antenna, a connection part for connecting the filter and the amplifier to the substrate, and a cover layer formed on the substrate to cover the filter and the amplifier, in which the filter and the amplifier are simultaneously packaged in a wafer chip state.

On the other hand, a mobile communication terminal according to still another embodiment of the present invention includes an antenna, and a filter module connected to the antenna, in which the filter module includes a substrate, a filter formed on the substrate and connected between the antenna and an amplifier, the amplifier formed on the substrate and connected between the filter and an RF output terminal to amplify a signal received from the antenna, a connection part for connecting the filter and the amplifier to the substrate; and a cover layer formed on the substrate to cover the filter and the amplifier, in which the filter and the amplifier are simultaneously packaged in a wafer chip state.

Figure 1:
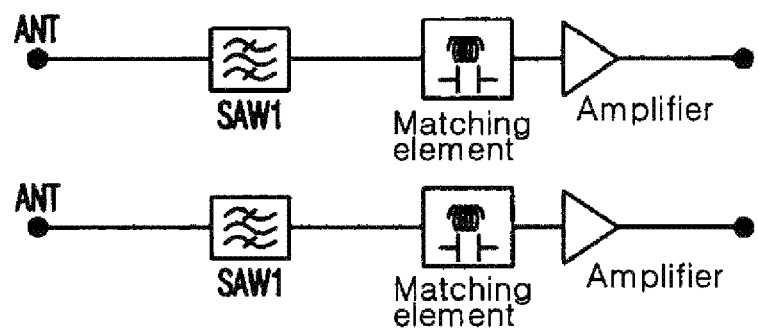
FIG. 1 is a view showing the configuration of a product of a filter module manufactured by mounting individual elements in a surface mount technology according to a conventional technique.

DESCRIPTION OF SYMBOLS 200, 300: Filter module
210, 310: Substrate
220, 320: Amplifier
230, 330: Filter
240: Solder
340: Packaged wafer chip
350: Connection part
250, 360: Cover layer
400: Substrate
421: Filter input terminal
422: Filter output terminal
423, 424: GND
430: Matching element
431: Via pad
441: Amplifier input terminal
442: Amplifier output terminal
510, 610, 710, 810, 910, 1010: Filter module
520, 620, 720, 820, 930, 1020, 1021: Filter
521, 621, 721, 723, 724, 821, 823, 824, 825: Filter input terminal
522, 622, 722, 822: Filter output terminal
530, 630, 730, 830, 920, 921, 1030, 1031: Amplifier
540, 541, 640, 641, 740, 741, 840, 841, 1040, 1041, 1042, 1043: Matching element
922, 923: Amplifier input terminal
924: Amplifier output terminal
1110, 1210, 1260: Filter module
1120, 1220, 1250: Filter
1121: Filter input terminal
1122: Filter output terminal
1130, 1230: Amplifier
1140, 1141, 1240: Matching element

DETAILED DESCRIPTION OF THE PREFERRED EMBODIMENT

Hereinafter, 'a filter module' according to the present invention will be described in detail with reference to the accompanying drawings. The disclosed embodiments are provided to enable those skilled in the art to easily understand the scope of the present invention, and the present invention is not limited by such embodiments. Moreover, matters illustrated in the drawings are schematized in order to describe or explain the embodiments of the present invention more easily, and hence, may be different from forms embodied actually.

Meanwhile, the constitutional components expressed below are merely examples for implementing the present invention. Accordingly, other components may be used in other implementations of the present invention without departing from the spirit and scope of the present invention.

In addition, the expression of 'including' a component is an expression of an 'open type' which merely refers to existence of a corresponding component, and it should not be construed as precluding additional components.

In addition, the expression such as 'a first, a second' or the like is used only for the purpose of distinguishing a plurality of configurations and do not limit the sequences or other features of the configurations.

Figure 2:
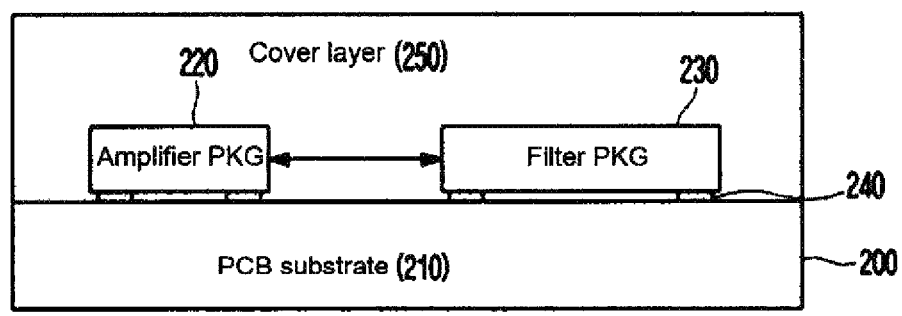
FIG. 2 is a cross-sectional view showing a product of a filter module manufactured by mounting individual elements on a PCB substrate in a surface mount technology according to a conventional technique.

FIG. 1 is a view showing the configuration of a product of a filter module manufactured by mounting individual elements in a surface mount technology according to a conventional technique, and FIG. 2 is a cross-sectional view showing a product of a filter module manufactured by mounting individual elements on a PCB substrate in a surface mount technology according to a conventional technique.

Referring to FIGS. 1 and 2, a technique of reducing a mounting area of a semiconductor component to a chip size as far as possible when a plurality of elements installed in a cellular phone or a communication device is included in a filter module has been developed conventionally in response to the request of integrating and miniaturizing the device, and, currently, a chip size package (CSP) method in which a chip area occupies 80% or more of the package area is emerged and used as a method of increasing density of wiring. However, since the chip area cannot be larger than a predetermined area of the package area, there is a disadvantage in that an integrated package area cannot be reduced to be smaller than a predetermined size (2.0×1.6 mm).

In addition, referring to FIG. 2, when a plurality of elements installed in a cellular phone or a communication device is arranged on a substrate, a surface mount technology of directly attaching individual semiconductor elements (a first filter, a second filter, a matching element, an amplifier and the like) is used. Although a miniaturizing technique has been developed gradually through the surface mount technology, the surface mount technology progresses surface mounting after packaging each element and thus is disadvantageous in that a wafer chip should be cut to have a margin in addition to the size of an element when the wafer chip is cut.

In addition, when the surface mount technology (SMT) is used, bonding should be progressed when the plurality of elements arranged on the substrate is in the form of a completed (packaged) product. Although such a surface mount technology has an advantage of saving cost owing to high density, easily automating assembly of a substrate and improving productivity, it is disadvantageous in that miniaturization of a component and reworking on correction of a defect are difficult and a new test method and a method of supplying components are required.

Figure 3:
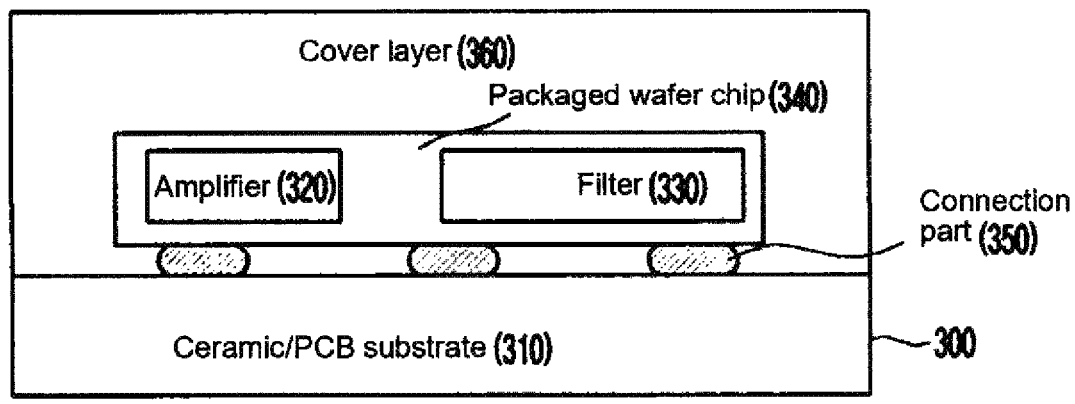
FIG. 3 is a cross-sectional view showing a product of a filter module manufactured using an ultrasonic bonding process according to an embodiment of the present invention.

FIG. 3 is a cross-sectional view showing a product of a filter module manufactured using an ultrasonic bonding process according to an embodiment of the present invention.

Referring to FIG. 3, the filter module 300 of the present invention may include a substrate 310, an amplifier 320, a plurality of filters 330, a wafer chip 340, a connection part 350 and a cover layer 360.

The substrate 310 is a plate on which an electrical circuit capable of changing wiring is formed and may include all of a print, a wiring plate and an insulation substrate formed of an insulation material which can form a conductive pattern on the surface of the insulation substrate. Particularly, the substrate of the present invention preferably formed of a printed circuit board (PCB) or a ceramic substrate.

At this point, the PCB substrate may express electrical wiring for connecting circuit components as a wiring diagram based on a circuit design and reproduce an electrical conductor on an insulator. In addition, the PCB substrate may mount electrical components, form a wire for connecting the electrical components as a circuit and mechanically fix the components in addition to the function of electrically connecting the components.

The amplifier 320 and the plurality of filters 330 are elements included in the filter module of the present invention, and when the elements are formed on a substrate, a plurality of elements can be packaged as one wafer chip 340 and attached to the substrate. At this point, a silicon wafer can be diced through a wafer level package (WLP) method.

The connection part 350 connects the plurality of filters and the amplifier to the substrate. Conventionally, solder is used for the connection part, and components are mounted on the PCB and fixed to the PCB by welding the solder. However, since the soldering method according to the surface mount technology (SMT) is limited in miniaturization of a product, in the present invention, a filter module is manufactured through the connection part using a wafer chip, in which an amplifier and a plurality of filters are packaged, through an ultrasonic boding process.

Particularly, the connection part is preferably a bump ball. At this point, the bump ball functions as a connector between a surface acoustic wave filter chip and the substrate, and when the filter chip is bonded to the substrate, a metal such as gold-to-gold, gold-to-aluminum or the like is preferably used. The bump ball is put on a wafer chip in which an amplifier and a plurality of filters are packaged, and the wafer chip is put on the substrate upside down. At this point, it is preferable that an electrode previously patterned on the substrate is attached to the bump ball, which is a connection part.

Subsequently, the substrate and the wafer chip are bonded together using an ultrasonic bonding process. The ultrasonic bonding process is a process which accomplishes strong boding by means of a physical diffusion action caused by mechanical vibration generated on two bonding surfaces due to ultrasonic vibration. An ultrasonic metal welder converts the vibration into electrical energy through a power supply, converts the electrical energy into mechanical vibration energy through a vibrator and amplifies the mechanical vibration energy. If the ultrasonic vibration energy generated like this is transferred to a metal weld deposit, strong bonding is generated on the boding surface of the metal weld deposit by forcible diffusion.

Since such a diffusion phenomenon of the two metal bonding surfaces is occurred by ultrasonic vibration, the ultrasonic bonding process may obtain high mechanical strength and electrical characteristics by removing the metal oxide film remaining on the metal surfaces and welding the surfaces. At this point, if ultrasonic waves are generated by the ultrasonic bonding process, the bump ball may be formed in the shape of an elliptical ball distorted in a predetermined direction while the bump ball moves around. For example, if the ultrasonic waves is shaken in the longitudinal direction of the substrate, the bump ball of a ball shape may attach the wafer chip and the substrate in the shape of an elliptical ball distorted in the longitudinal direction of the substrate.

The cover layer 360 is formed on the substrate to cover the plurality of filters and the amplifier. At this point, the cover layer preferably uses an epoxy film, and the filter module can be manufactured by forming the cover layer on the substrate and the wafer chip, fixing the cover layer in a thermal pressing (laminating) method, and dicing the wafer chip in a predetermined size.

Meanwhile, the filter module of the present invention may further include a matching element. Impedance matching is a method of reducing, when an output terminal and an input terminal are connected, reflection caused by difference of impedance between the two different connection terminals, and the matching element performs a function of matching impedance of the elements formed on the substrate.

Figure 4:
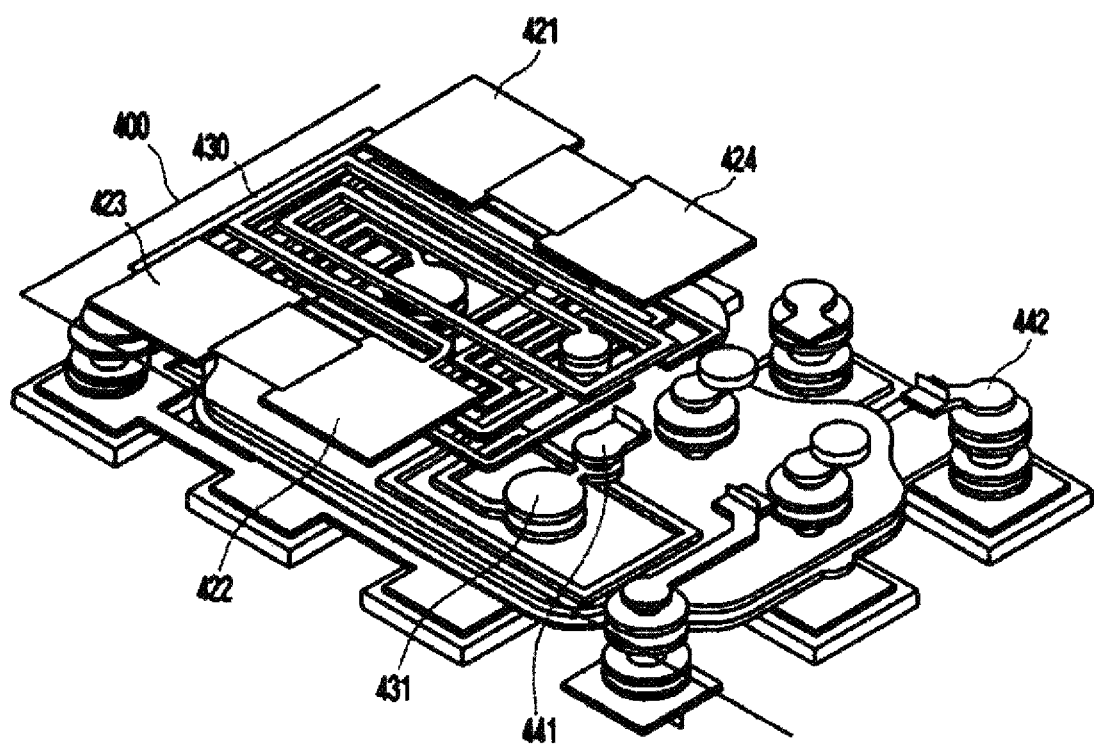
FIG. 4 is a view showing the configuration of a substrate of a filter module according to an embodiment of the present invention.
Figure 5:
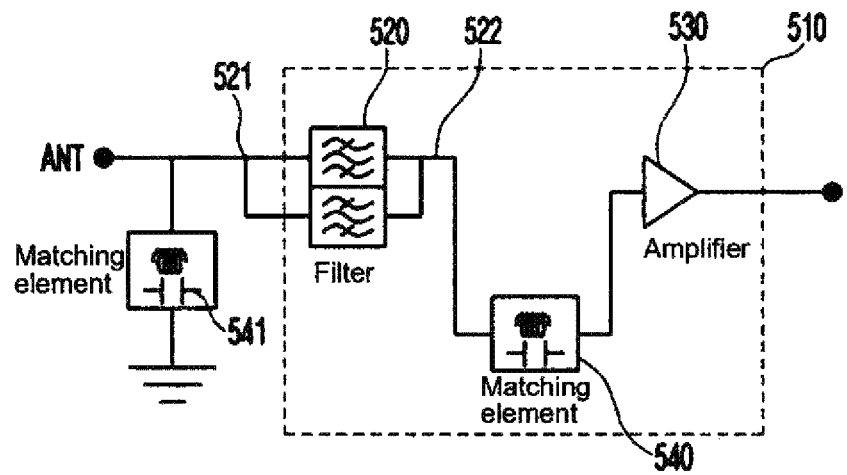
FIGS. 5 and 6 are exemplary views showing the configuration of a filter module including a plurality of filters, an amplifier and a matching element according to an embodiment of the present invention.
Figure 6:
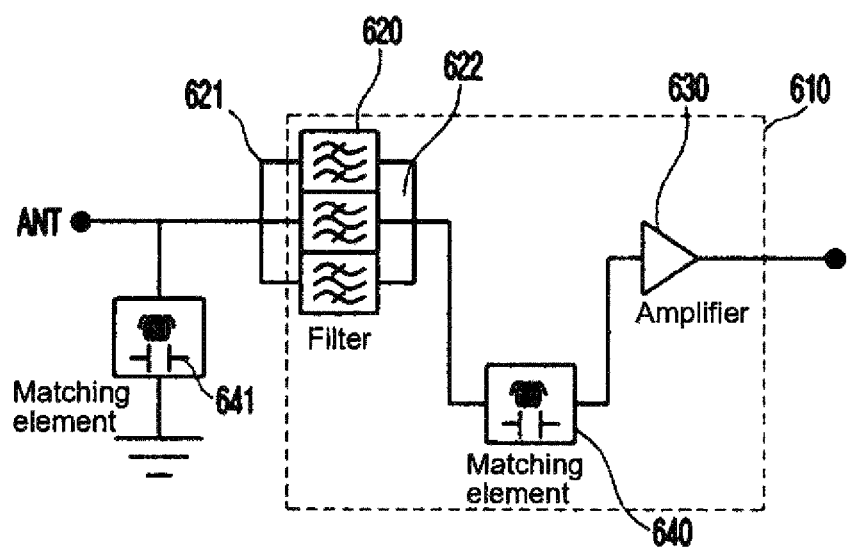

At this point, the matching element can be packaged as a wafer chip at a time together with the amplifier, the plurality of filters and the like as shown in FIGS. 4 to 6 and can be appeared at an appropriate position of the input terminal and the output terminal to be separated from the filter module as shown in FIGS. 7a, 7b, 8a, 8b and 9. Particularly, although the size of the filter module itself can be very large in some cases if the matching element is packaged together with the amplifier and the filters, this problem can be solved by arranging the elements of the filter module and accommodating the matching element at an appropriate position. This will be described in detail with reference to FIG. 4.

FIG. 4 is a view showing the configuration of a substrate of a filter module according to an embodiment of the present invention.

Referring to FIG. 4, the substrate included in the filter module of the present invention may include a filter input terminal 421, a filter output terminal 422, grounds (GND) 423 and 424, a matching element 430, a via pad 431, an amplifier input terminal 441 and an amplifier output terminal 442. At this point, after putting the bump ball, which is a connection part, on a packaged wafer chip including the amplifier, the filter and the matching element of FIG. 3, the wafer chip is connected to the previously patterned electrodes such as the filter input terminal, the filter output terminal, the amplifier input terminal and the amplifier output terminal by turning the wafer chip upside down.

First, an external data is received from an antenna through the filter input terminal 421 and moves to the filter output terminal 422 by way of a filter. The filter output terminal is connected to the matching element 430, and the data is transferred to the amplifier input terminal 441 through the via pad 431 after impedance matching is performed by the matching element. Subsequently, the data passes through the amplifier and can be transferred to an RF output terminal by way of the amplifier output terminal 442.

At this point, an input terminal and an output terminal of each of the plurality of filters and an input terminal and an output terminal of the amplifier are formed on the substrate, and the input terminal and the output terminal of each of the plurality of filters can be electrically connected to the input terminal and the output terminal of the amplifier through the via pad formed on the substrate. The substrate can be configured in six layers, and since several electrodes and pads can be positioned in each layer, electrodes in different layers are connected through the via pad.

Meanwhile, the matching element 430 can be formed in the shape of a layered spiral in a space between the input terminals and the output terminals of the plurality of filters. Since a plurality of filters and an amplifier are configured as a packaged wafer layer in the filter module of the present invention, space can be utilized only when the matching element is placed at an appropriate position, and the matching element is preferably formed in a space between the input and output terminals of a filter and the ground GND.

Particularly, the matching element is configured of a capacitor or an inductor, and an electrode line is extended long to be configured in the shape of a spiral in the present invention to perform a function of an inductor. At this point, since capacity of the inductor can be insufficient if the matching element of the spiral shape is formed only in one layer, in the present invention, the matching element may be configured in the shape of a layered spiral extended from layer 1 to 6 so that optimum impedance matching can be provided between the substrate and the elements.

Accordingly, since the plurality of filters, the amplifier and the matching element can be formed to be appropriate to an optimum size of a substrate, the substrate can be manufactured to have a long side of 1.4 to 1.6 mm and a short side of 1.0 to 1.2 mm. When individual packaging elements are fixed to a substrate in the conventional surface mount technology (SMT), the substrate cannot be reduced to be smaller than 2.0 mm×1.6 mm. However, the present invention is advantageous in that the area of the substrate can be reduced to about a half by simultaneously packaging a plurality of elements using an ultrasonic bonding process.

FIGS. 5 and 6 are exemplary views showing the configuration of a filter module including a plurality of filters, an amplifier and a matching element according to an embodiment of the present invention, and FIGS. 7a, 7b, 8a and 8b are exemplary views showing the configuration of a filter module including a plurality of filters and an amplifier according to an embodiment of the present invention. FIG. 9 is an exemplary view showing the configuration of a filter module including a plurality of amplifiers and a filter according to an embodiment of the present invention.

Figure 7A:
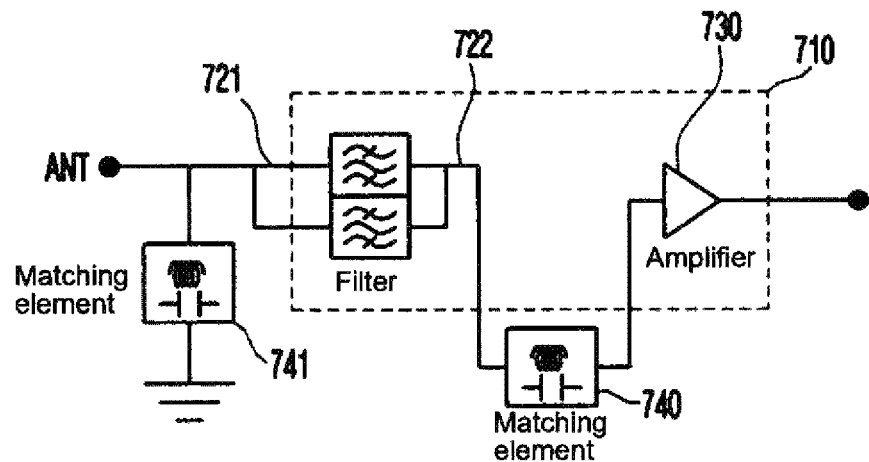
FIGS. 7a, 7b, 8a and 8b are exemplary views showing the configuration of a filter module including a plurality of filters and an amplifier according to an embodiment of the present invention.
Figure 7B:
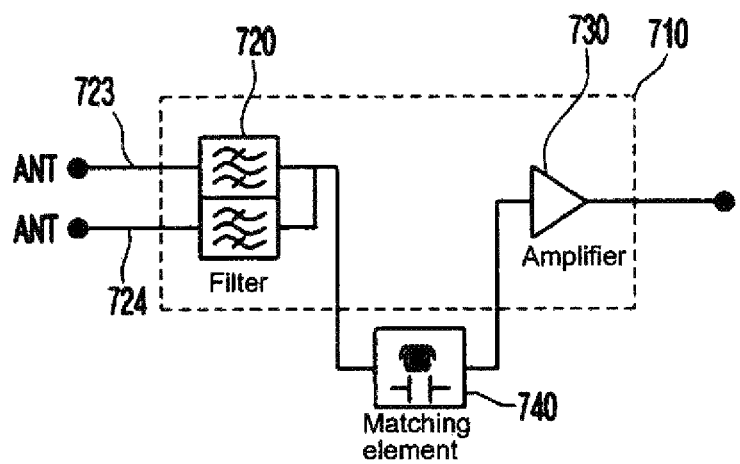
Figure 8A:
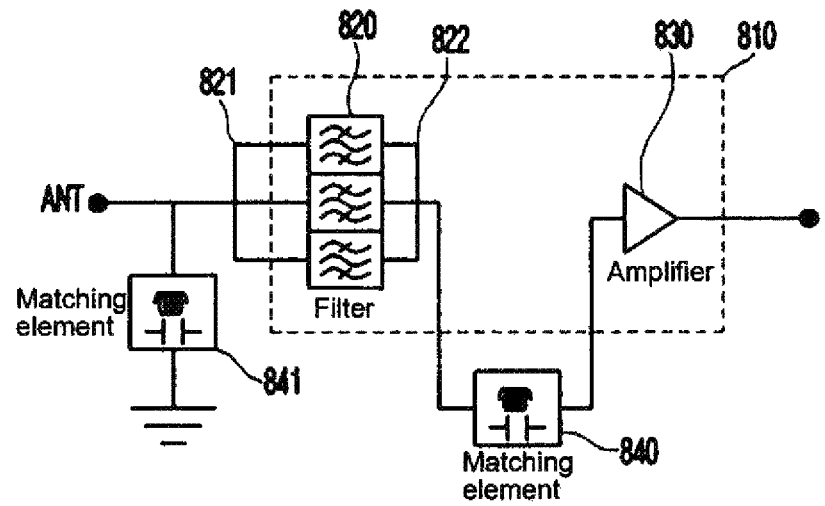
Figure 8B:
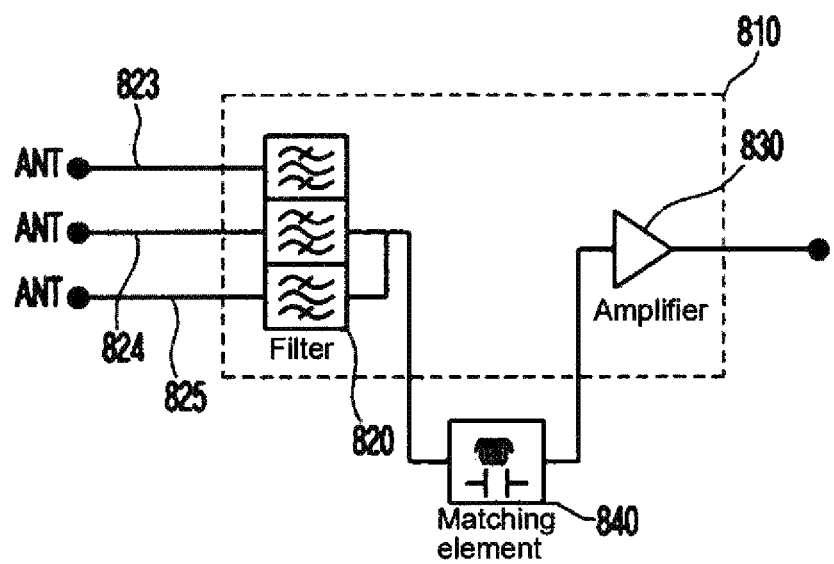
Figure 9:
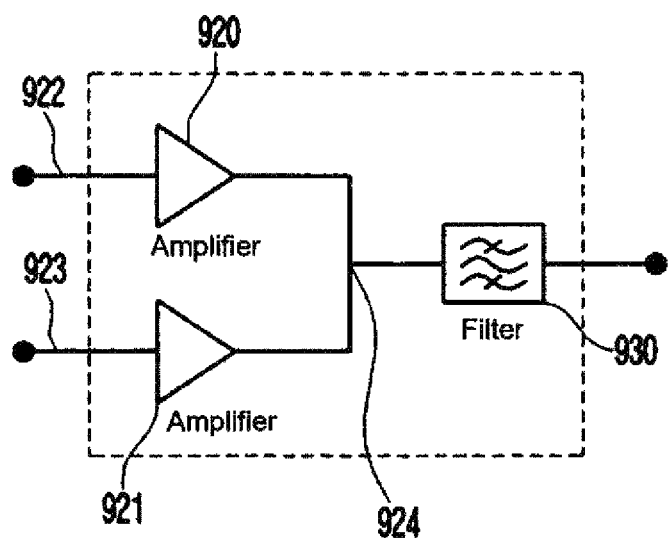
FIG. 9 is an exemplary view showing the configuration of a filter module including a plurality of amplifiers and a filter according to an embodiment of the present invention.

At this point, the filters shown in FIGS. 5, 7a and 7b are dual filters including a first filter and a second filter, and the filters shown in FIGS. 6, 8a and 8b are triple filters including a first filter, a second filter and a third filter. FIGS. 5 and 6 show filter modules including a matching element, and FIGS. 7a, 7b, 8a and 8b show filter modules which do not include a matching element.

In addition, a filter module of the present invention may include a plurality of filters and an amplifier packaged simultaneously or sequentially or further include a matching element packaged simultaneously or sequentially together with the filters and the amplifier. The size of the module can be reduced, compared with the surface mount technology (SMT), by simultaneously or sequentially packaging the components, and the mounting area can be reduced by further including an external matching element through implementation of patterning the substrate.

At this point, the plurality of filters may pass frequencies different from each other, input terminals are independent from each other, and output terminals are connected to each other. Recently, a cellular phone or a communication terminal uses various frequencies through a multi-channel technique.

For example, a user may use GPS, 3G (WCDMA) and 4G (LTE) channels through a cellular phone. The user uses a GPS channel to confirm a mobile map, a 3G channel to begin a communication, and a 4G channel to access the Internet. At this point, a filter for each channel is assigned to each of the plurality of filters, and when a corresponding channel is used, a signal may pass through a preset filter.

In addition, in the filter module of the present invention, the matching element can be connected between the output terminals of the plurality of filters and the input terminal of the amplifier in order of the plurality of filters, the matching element and the amplifier, or, as shown in FIG. 9, a plurality of amplifiers may be connected to the output terminals of antennas, and a filter may be connected to the amplifiers.

Meanwhile, a method of manufacturing a filter module according to an embodiment of the present invention includes the steps of simultaneously or sequentially packaging a plurality of filters and an amplifier in a wafer chip state, forming a connection part on the wafer chip, turning the wafer chip upside down and connecting an electrode previously patterned on a substrate to the connection part, bonding the substrate and the wafer chip using an ultrasonic bonding process, forming a cover layer on the substrate and the wafer chip, thermally compressing the cover layer, and dicing the wafer chip in a predetermined size.

The amplifier of the present invention is preferably formed as a low noise amplifier (LNA). The LNA refers to a high frequency amplifier manufactured to reduce a total noise figure of a receiver and is used to propagate an input voltage in a line-of-sight communication circuit or the like having a big propagation loss.

The filter of the present invention preferably uses a surface acoustic wave (SAW) filter or a notch filter. The notch filter has a characteristic in that only a specific frequency point is difficult to pass through and, among band rejection filters (BRF), it does not pass frequencies of an extremely narrow band.

The surface acoustic wave is an acoustic wave propagated along the surface of an elastic substrate, and the acoustic wave is generated from an electrical signal as a result of a piezoelectric effect. At this point, the electric field of the acoustic wave is concentrated around the surface of the substrate and may interact with conduction electrons of a semiconductor placed right on the surface, and a medium for minimizing energy loss in the system can be selected by physically separating the semiconductor from the substrate on which the acoustic wave propagates. An electro-mechanical element, which substitutes for an electronic circuit using the interaction between the surface acoustic wave having such a characteristic and the conduction electrons of the semiconductor, is a surface acoustic wave filter. The surface acoustic wave filter is applied as an RF or IF filter chip for providing frequency selectivity, and it can perform a function of passing a desired frequency and removing an unnecessary frequency.

Meanwhile, the present invention also includes a mobile communication terminal to which the embodiments described above are applied, and the mobile communication terminal include an antenna and a filter module connected to the antenna, and the filter module may include a substrate, a plurality of filters formed on the substrate, an amplifier formed on the substrate, a connection part for connecting the plurality of filters and the amplifier to the substrate, and a cover layer formed on the substrate to cover the plurality of filters and the amplifier.

FIGS. 10a, 10b, 11a and 11b are exemplary views showing the configuration of a filter module including a plurality of filters and a plurality of amplifiers according to another embodiment of the present invention.

Referring to FIGS. 10a to 11b, a filter module of the present invention includes a substrate, a plurality of filters formed on the substrate, a plurality of amplifiers formed on the substrate and electrically connected to the plurality of filters, a connection part for connecting the plurality of filters and the plurality of amplifiers to the substrate, and a cover layer formed on the substrate to cover the plurality of filters and the plurality of amplifiers, and the plurality of filters and the plurality of amplifiers are simultaneously or sequentially packaged. Since the plurality of filters and the plurality of amplifiers are simultaneously or sequentially packaged, integration efficiency can be further improved compared with the packaging method of FIG. 5, and the size of the filter module itself can be reduced. The plurality of filters and the plurality of amplifiers may be simultaneously or sequentially packaged in a predetermined space in a wafer chip state.

At this point, since the plurality of filters is at least any one of a single SAW filter, a dual SAW filter and a triple SAW filter, the plurality of filters and the plurality of amplifiers may be matched one-to-one, or several filters can be matched to one amplifier.

Figure 10A:
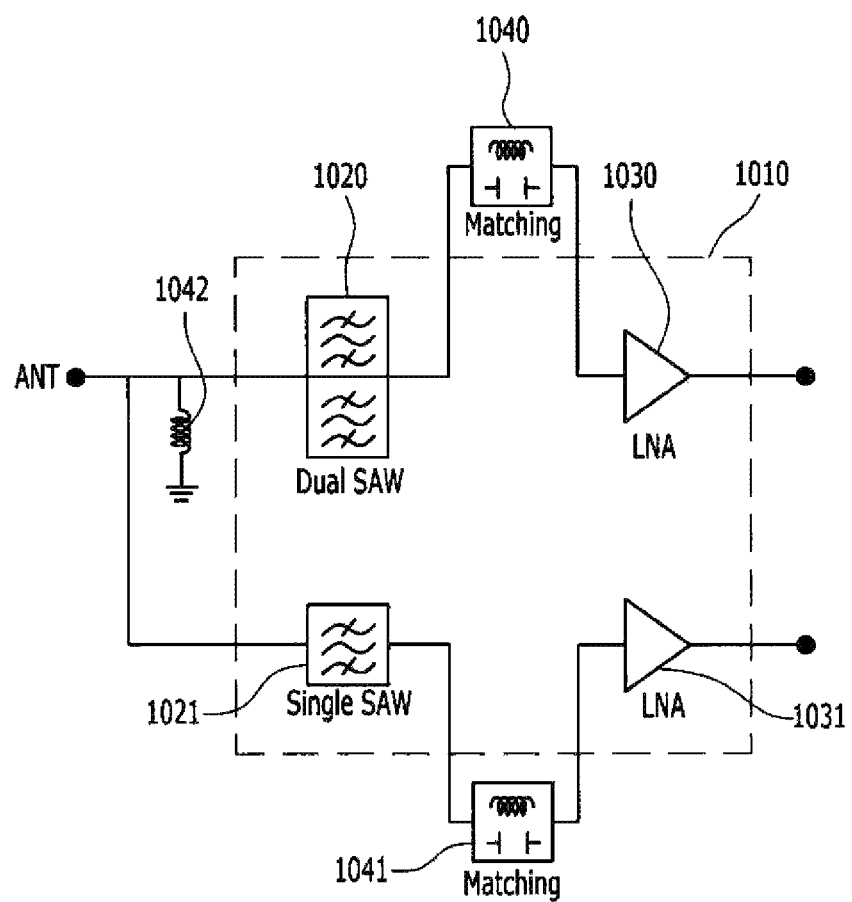
FIGS. 10a, 10b, 11a and 11b are exemplary views showing the configuration of a filter module including a plurality of filters and a plurality of amplifiers according to another embodiment of the present invention.
Figure 10B:
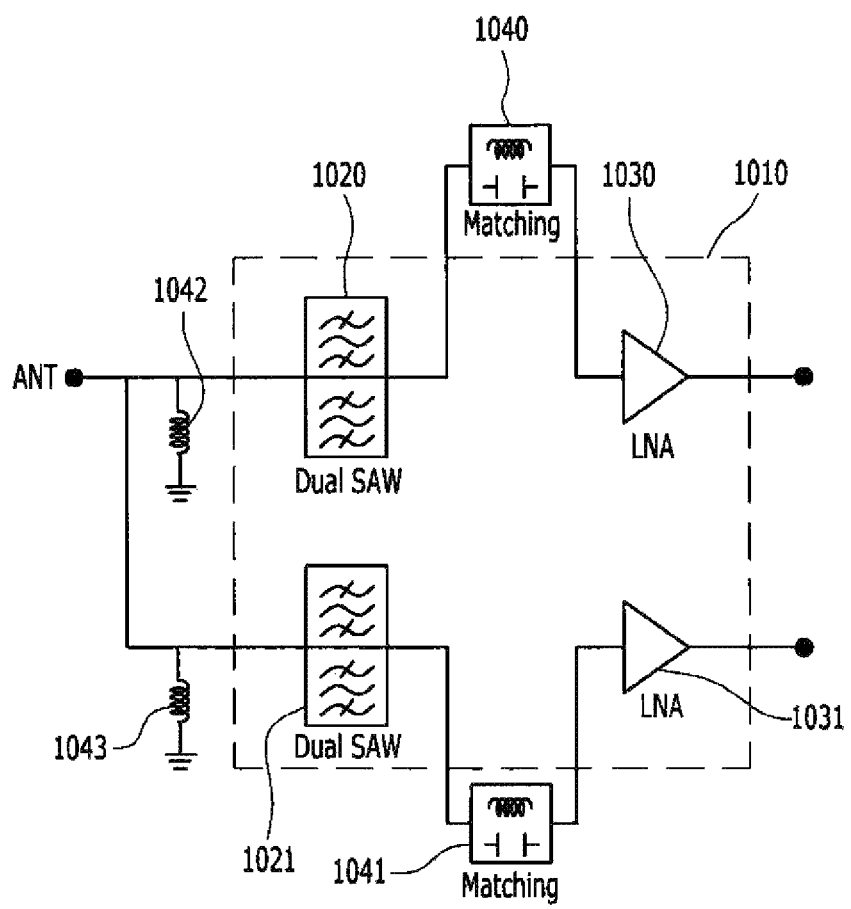

FIG. 10a shows an embodiment in which the matching element 1042 outside the package is formed only at the input terminal side of a dual SAW filter, and FIG. 10b shows an embodiment in which the matching elements 1042 and 1043 outside the package are respectively formed at the input terminal of each filter.

Figure 11A:
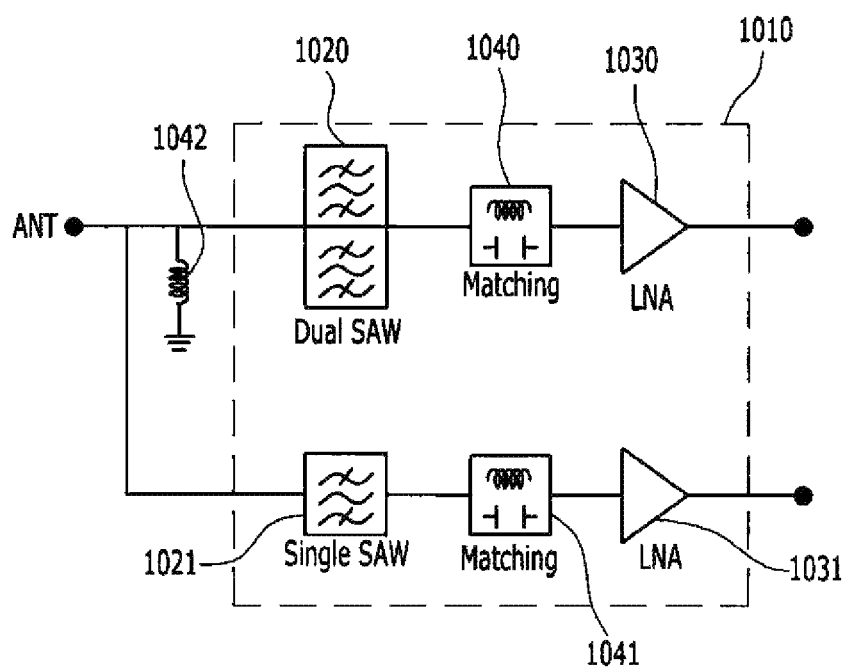
Figure 11B:
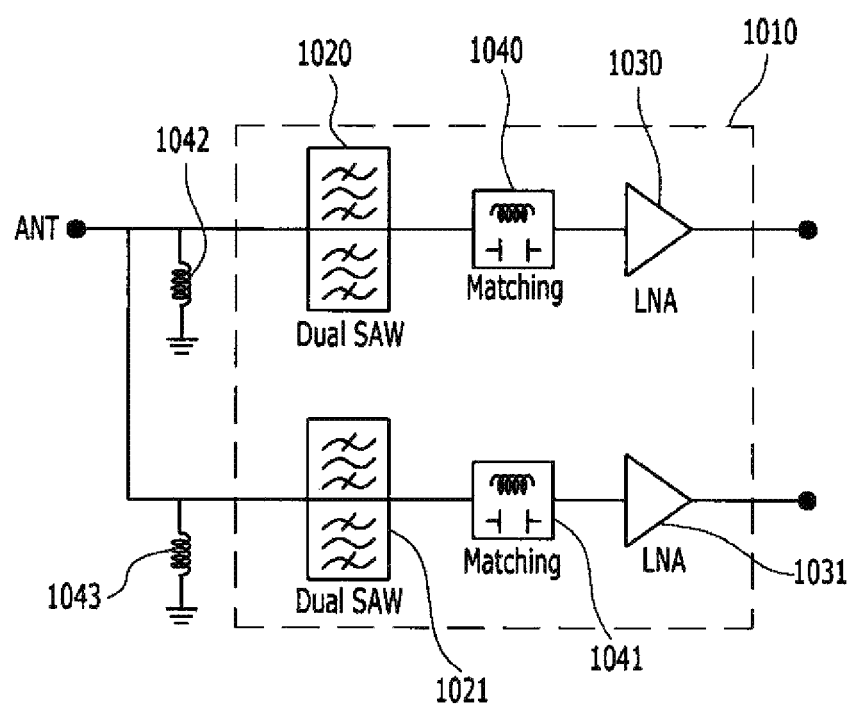

In addition, referring to FIG. 11a or 11b, the filter module of the present invention further includes a plurality of matching elements for matching impedance of the elements formed on the substrate. At this point, the plurality of filters, the plurality of amplifiers and the plurality of matching elements are simultaneously or sequentially packaged. The size of the module can be reduced, compared with the surface mount technology (SMT), by packaging all the matching elements connected to each amplifier, and the mounting area can be reduced by further including an external matching element through implementation of patterning the substrate.

Meanwhile, although it is shown as if there is only one antenna in FIGS. 10a to 11b, several antennas may be formed to be connected to each filter or to a plurality of filters. For example, three filters can be connected to two antennas, or three filters can be connected to three antennas, respectively. This can be freely selected according to the design style of a user.

In addition, in the case of FIGS. 10a to 11b, since only the number of filters, amplifiers and matching elements is changed compared with that of the plurality of filters and amplifiers disclosed in FIGS. 5 to 8b and the method of forming the filters, the amplifiers and the matching elements on the substrate is exactly the same, all applicable matters can be applied together.

Figure 12:
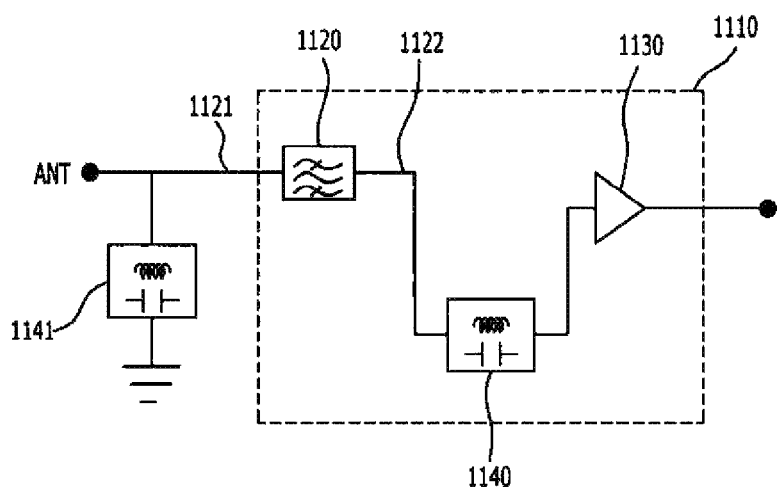
FIG. 12 is an exemplary view showing the configuration of a filter module including filters, amplifiers and matching elements according to still another embodiment of the present invention
Figure 13:
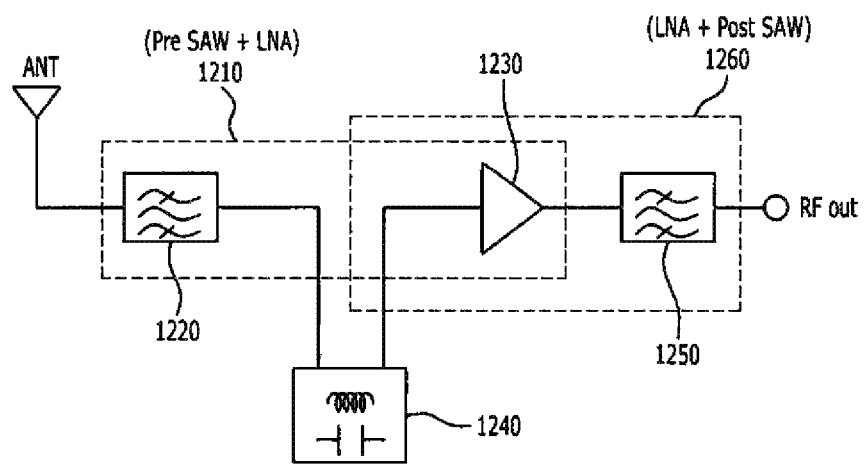
FIG. 13 is an exemplary view showing the configuration of a filter module including a filter and an amplifier according to still another embodiment of the present invention.

On the other hand, in a filter module according to still another embodiment of the present invention, the matching elements can be packaged as a wafer chip at a time together with the amplifiers, filters and the like as shown in FIG. 12 or can be appeared at an appropriate position of the input terminal and the output terminal to be separated from the filter module as shown in FIG. 13. Particularly, although the size of the filter module itself is very large in some cases if the matching elements are packaged together with the amplifiers and the filters, this problem can be solved by arranging the elements of the filter module and accommodating the matching elements at appropriate positions. This will be described in detail with reference to FIGS. 12 and 13.

FIG. 12 is an exemplary view showing the configuration of a filter module including filters, amplifiers and matching elements according to still another embodiment of the present invention, and FIG. 13 is an exemplary view showing the configuration of a filter module including a filter and an amplifier according to still another embodiment of the present invention. At this point, FIG. 12 shows a filter module including a matching element, and FIG. 13 shows a filter module which does not include a matching element.

Particularly, referring to FIGS. 12 and 13, a filter module according to still another embodiment of the present invention is packaged to include one filter. Since the filter module is packaged using only one filter without a plurality of filters, it is advantageous in miniaturization and integration of the filter module.

Referring to FIG. 12, a filter module of the present invention includes a substrate, a filter formed on the substrate and connected between an antenna and an amplifier, the amplifier formed on the substrate and connected between the filter and an RF output terminal to amplify a signal received from the antenna, a connection part for connecting the filter and the amplifier to the substrate, and a cover layer formed on the substrate to cover the filter and the amplifier, and the filter and the amplifier are simultaneously packaged in a wafer chip state. At this point, the filter module may further include a matching element for matching impedance of the elements formed on the substrate between the antenna and the amplifier.

In addition, a filter module of the present invention can be implemented in the form of a filter module 1210 arranging a filter 1220 and an amplifier 1230 in order and a filter module 1260 arranging an amplifier 1230 and a filter 1250 in order as shown in FIG. 12. In this case, the matching element 1240 can be arranged between the filter and the amplifier, between the antenna and the filter or between the filter and the RF output terminal to be appropriate to the arrangement of the elements in the substrate of the filter module.

A conventional surface mount technology (SMT) has a problem in that there is a limit in integration and miniaturization of a circuit and a module smaller than a module area of 2.0×1.6 mm cannot be formed. However, a filter module of the present invention can implement a filter module miniaturized to about a half compared with a conventional module area in a method of bonding a plurality of amplifiers and filters on a substrate through a connection part and bonding them using an ultrasonic bonding process.

In addition, the present invention may include only an amplifier and a filter in a filter module or may include an amplifier, a filter and a matching element and stabilize the circuit by matching impedance of the elements formed on the substrate.

In addition, the present invention is advantageous in that since input terminals of a plurality of filters are independent from each other and output terminals thereof are connected to each other, the plurality of filters may respectively pass a different frequency, and thus the filter module may process all the various frequencies such as frequencies of GPS, 3G (WCDMA), 4G (LTE) and the like used in a communication device recently.

The embodiments of the present invention described above are disclosed for illustrative purposes, and the present invention is not to be restricted by the embodiments. In addition, those skilled in the art can make diverse changes and modifications within the spirit and scope of the present invention, and those changes and modifications should be regarded as being included within the scope of the present invention.

What is claimed is:

1. A filter module comprising:
   a substrate;
   a plurality of filters formed on the substrate;
   an amplifier formed on the substrate and electrically connected to the plurality of filters;
   a connection part for connecting the plurality of filters and the amplifier to the substrate;
   a cover layer formed on the substrate to cover the plurality of filters and the amplifier; and
   a matching element formed on the substrate for matching impedances of the plurality of filters and the amplifier,
   wherein the plurality of filters and the amplifier are simultaneously or sequentially packaged, and
   wherein the matching element is formed in a shape of a layered spiral in a space between input terminals and output terminals of the plurality of filters.

2. The filter module according to claim 1, wherein the input terminal and the output terminal of each of the plurality of filters and an input terminal and an output terminal of the amplifier are formed on the substrate.

3. The filter module according to claim 2, wherein the input terminal and the output terminal of each of the plurality of filters are electrically connected to the input terminal and the output terminal of the amplifier through a via pad formed on the substrate.

4. The filter module according to claim 1, wherein the input terminals of the plurality of filters are independent from each other, and the output terminals thereof are connected to each other.

5. The filter module according to claim 1, wherein the plurality of filters are connected in parallel.

6. The filter module according to claim 1, wherein the connection part is a bump ball.

7. The filter module according to claim 6, wherein the bump ball is in a shape of an elliptical ball distorted in a predetermined direction.

8. The filter module according to claim 6, wherein the connection part is connected to an electrode previously patterned on the substrate.

9. The filter module according to claim 1, wherein the plurality of filters passes frequencies different from each other.

10. The filter module according to claim 1, wherein the matching element is connected between the output terminals of the plurality of filters and the input terminal of the amplifier.

11. The filter module according to claim 1, wherein the plurality of filters is at least any one of a single SAW filter, a dual SAW filter and a triple SAW filter.

12. A filter module comprising:
    a substrate;
    a filter formed on the substrate and connected between an antenna and an amplifier;
    the amplifier formed on the substrate and connected between the filter and an RF output terminal to amplify a signal received from the antenna;
    a connection part for connecting the filter and the amplifier to the substrate;
    a cover layer formed on the substrate to cover the filter and the amplifier; and
    a matching element formed on the substrate for matching impedances of the filter and the amplifier,
    wherein the filter and the amplifier are simultaneously packaged in a wafer chip state, and
    wherein the matching element is formed in a shape of a layered spiral in a space between an input terminal and output terminal of the filter.

13. A mobile communication terminal comprising:
    an antenna; and
    a filter module connected to the antenna, wherein the filter module includes:
    a substrate;
    a filter formed on the substrate and connected between the antenna and an amplifier;

the amplifier formed on the substrate and connected between the filter and an RF output terminal to amplify a signal received from the antenna;
a connection part for connecting the filter and the amplifier to the substrate;
a cover layer formed on the substrate to cover the filter and the amplifier; and
a matching element formed on the substrate for matching impedances of the filter and the amplifier
wherein the filter and the amplifier are simultaneously packaged in a wafer chip state, and
wherein the matching element is formed in a shape of a layered spiral in a space between an input terminal and output terminal of the filter.

14. A mobile communication terminal comprising:
an antenna; and
a filter module connected to the antenna, wherein the filter module includes:
a substrate;
a plurality of filters formed on the substrate;
an amplifier formed on the substrate;
a connection part for connecting the plurality of filters and the amplifier to the substrate;
a cover layer formed on the substrate to cover the plurality of filters and the amplifier; and
a matching element formed on the substrate for matching impedances of the plurality of filters and the amplifier,
wherein the plurality of filters and the amplifier are simultaneously or sequentially packaged, and
wherein the matching element is formed in a shape of a layered spiral in a space between input terminals and output terminals of the plurality of filters.

15. A filter module comprising:
a substrate;
a plurality of filters formed on the substrate;
a plurality of amplifiers formed on the substrate and electrically connected to the plurality of filters;
a connection part for connecting the plurality of filters and the plurality of amplifiers to the substrate;
a cover layer formed on the substrate to cover the plurality of filters and the plurality of amplifiers; and
a plurality of matching elements formed on the substrate for matching impedances of the plurality of filters and the plurality of amplifiers,
wherein the plurality of filters and the plurality of amplifiers are simultaneously or sequentially packaged, and
wherein each of the matching elements are formed in a shape of a layered spiral in a space between input terminals and output terminals of the plurality of filters.

16. The filter module according to claim 15, wherein the plurality of filters is at least any one of a single SAW filter, a dual SAW filter and a triple SAW filter.

17. The filter module according to claim 15, wherein the plurality of filters, the plurality of amplifiers and the plurality of matching elements are simultaneously packaged.

* * * * *